(12) United States Patent
Guenther et al.

(10) Patent No.: US 9,620,730 B2
(45) Date of Patent: Apr. 11, 2017

(54) METHOD FOR MANUFACTURING AN ORGANIC ELECTRONIC DEVICE AND ORGANIC ELECTRONIC DEVICE

(71) Applicant: Novaled GmbH, Dresden (DE)

(72) Inventors: Alrun Guenther, Dresden (DE); Hans Kleemann, Dresden (DE); Bjoern Luessem, Dresden (DE); Karl Leo, Dresden (DE); Daniel Kasemann, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 14/826,350

(22) Filed: Aug. 14, 2015

(65) Prior Publication Data

US 2016/0049605 A1 Feb. 18, 2016

(30) Foreign Application Priority Data

Aug. 15, 2014 (DE) ........................ 10 2014 111 688

(51) Int. Cl.
*H01L 51/10* (2006.01)
*H01L 51/00* (2006.01)
*H01L 51/05* (2006.01)

(52) U.S. Cl.
CPC ........ *H01L 51/105* (2013.01); *H01L 51/0001* (2013.01); *H01L 51/0007* (2013.01); *H01L 51/057* (2013.01); *H01L 51/0046* (2013.01); *H01L 51/0545* (2013.01)

(58) Field of Classification Search
None
See application file for complete search history.

(56) References Cited

U.S. PATENT DOCUMENTS

2014/0299869 A1* 10/2014 Kugler ............... H01L 51/0047
257/40
2014/0322656 A1* 10/2014 Wright ................... G03F 7/038
430/325

FOREIGN PATENT DOCUMENTS

EP 2 784 839 A1 10/2014

* cited by examiner

*Primary Examiner* — Fernando L Toledo
*Assistant Examiner* — Valerie N Newton
(74) *Attorney, Agent, or Firm* — Eversheds Sutherland (US) LLP (57) ABSTRACT

Organic electronic devices and methods for making organic electronic devices are provided. The organic electronic devices may include a gate electrode, a gate insulator, an organic semiconducting layer, a contact improving layer, a source electrode, and a drain electrode. The source electrode and the drain electrode may be arranged on the contact improving layer, and the contact improving layer may include an organic dopant material which is soluble in Hydrofluorether.

13 Claims, 10 Drawing Sheets

METHOD FOR MANUFACTURING AN ORGANIC ELECTRONIC DEVICE AND ORGANIC ELECTRONIC DEVICE

CROSS REFERENCES TO RELATED APPLICATIONS

This application claims priority to German Application No. 10 2014 111 688.7, filed Aug. 15, 2014, the entire contents of which are incorporated by reference herein.

FIELD OF THE INVENTION

The disclosure is in the area of organic electronics, in particular organic transistors. A method for producing an organic electronic device and an organic electronic device are provided. In particular, a method for producing planar and vertical organic field effect transistors is disclosed (OFET—organic field effect transistor, VOFET—vertical organic field effect transistor).

BACKGROUND

Planar and vertical organic field effect transistors are electrical elements known from semiconductor technologies. The function of both kinds of transistors is very similar, but the transistors are different in their geometry. In the planar OFET, three electrodes (gate electrode, source electrode and drain electrode) are arranged according to the conventional concept of the transistor. The source electrode and the drain electrode are arranged opposite to each other, wherein the gate electrode is arranged above or below the source electrode and the drain electrode. In the VOFET, all three electrodes are arranged on top of each other in a stacked manner.

The function of both transistor concepts is described in the following: Between the source electrode (also called the source) and the drain electrode (also called the drain) flows a current which is controlled by the gate electrode (also called the gate) via an electrical voltage. In contrast to the planar OFET, the current flows in the VOFET in a vertical channel between the source and the drain. Both concepts are also known in conventional silicon technology. Using organic materials in the transistors lead to the advantage of cheaper materials and a potential application on flexible substrates. Essential criteria for an organic device are high current densities at low on-set voltages and a high ratio between ON current and OFF current. In particular, the ON current can be improved by inserting dopants adjacent to the source electrode and/or the drain electrode.

In a previous application EP 2 784 839 A1, incorporated herein by the reference, it was shown that inserting the organic compound F6-TCNNQ as contact dopant between the electrodes (source and/or drain) and a semiconducting material improves the injection of charge carriers in an organic transistor.

SUMMARY

It is an object to provide improved technologies for producing organic electronic devices. In particular, a structuring of the devices shall be simplified.

A method of manufacturing an organic electronic device and an organic electronic device are disclosed. In embodiments, the methods of manufacturing an organic electronic device comprise providing a layered device structure, the layered device structure comprising a plurality of electrodes and an electronically active region being provided in electrical contact with at least one of the plurality of electrodes, said providing of the layered device structure comprising steps of providing an organic semiconducting layer, applying a contact improving layer to the organic semiconducting layer by depositing an organic dopant material, wherein the organic dopant material is soluble in Hydrofluorether, depositing a layer material on the contact improving layer, and structuring the contact improving layer. In embodiments, the organic electronic devices comprise a gate electrode, a gate insulator arranged at least in part on the gate electrode, an organic semiconducting layer provided on the gate insulator, a contact improving layer arranged at least in part on the organic semiconducting layer, a source electrode, and a drain electrode, wherein the source electrode and the drain electrode are arranged on the contact improving layer, and wherein the contact improving layer comprises an organic dopant material which is soluble in Hydrofluorether.

In one aspect, a method of manufacturing an organic electronic device is disclosed. The method comprises providing a layered device structure, the layered device structure comprising a plurality of electrodes and an electronically active region being provided in electrical contact with at least one of the plurality of electrodes. The providing of the layered device structure comprises steps of: providing an organic semiconducting layer, applying a contact improving layer to the organic semiconducting layer by depositing an organic dopant material, depositing a layer material on the contact improving layer, and structuring the contact improving layer. The organic dopant material is soluble in Hydrofluorether.

In another aspect, an organic electronic device is disclosed. The device comprises: a gate electrode, a gate insulator arranged at least in part on the gate electrode, an organic semiconducting layer provided on the gate insulator, a contact improving layer arranged at least in part on the organic semiconducting layer, a source electrode, and a drain electrode. The source electrode and the drain electrode are arranged on the contact improving layer. The contact improving layer comprises an organic dopant material which is soluble in Hydrofluorether.

The contact improving layer may comprise a dopant material and a matrix material. The dopant material may be distributed in the matrix material. The matrix material may be an organic matrix material. Alternatively, the contact improving layer may be made only of the dopant material.

A solubility of the organic dopant material in Hydrofluorether may be larger than 0.5 mg/ml. The solubility of the organic dopant material in Hydrofluorether can be larger than 10 mg/ml.

The Hydrofluorether may be selected from the group of HFE 7x00 (x=1 to 6) or any combination thereof.

The organic dopant material may a fluorinated Buckminster fullerene, for example a compound having formula $C_{60}F_x$, wherein x is an integer from 18 to 50. The organic dopant material may be $C_{60}F_{36}$ or $C_{60}F_{48}$.

The method may further comprise a step of dipping the layered device structure in Hydroflourether. The method may further comprise a step of rinsing the layered device structure with Hydroflourether. The steps of dipping and/or rinsing the layered device structure can be combined with each other. For example, the layered device structure can be first dipped in Hydroflourether. Then, the layered device structure can be rinsed with Hydroflourether.

The method may further comprise applying a structuring layer to the organic semiconducting layer, the structuring layer having a first region and a second region, the first region being covered by a layer material, applying the contact improving layer at least in the first region, and removing the structuring layer at least in the second region.

Said providing the structuring layer may further comprise using a photo lithographic process.

Said using the photo lithographic process may further comprise depositing a photo resist cover on the organic semiconducting layer and structuring the photo resist cover, said structuring comprising steps of illuminating and removing the photo resist cover, thereby at least partially removing the photo resist cover in at least the second region, but not the first region.

Said depositing the photo resist cover may further comprise depositing a protection layer on the organic semiconducting layer, and depositing a photo resist layer on the protection layer.

The photo lithographic process may be performed by using a fluorine based photo lithography.

The contact improving layer may be provided with a layer thickness of 1 nm to 100 nm.

The features disclosed for the method can also be applied to the device and vice versa.

DESCRIPTION OF EMBODIMENTS

Following, embodiments are described with reference to figures. Here show:

FIG. 1 a schematic cross section of an organic electronic device,
FIG. 2 a top-view of the device of FIG. 1,
FIG. 3 a transfer curve,
FIG. 4 another transfer,
FIG. 5 a further transfer curve,
FIG. 6 a schematic VOFET,
FIG. 7 transfer curves of VOFETs,
FIG. 8 a schematic OFET,
FIG. 9 transfer curves of OFETs,
FIG. 10 another transfer curve,
FIG. 11 images of lift offs,
FIG. 12 *a-g* schematic etching process, and
FIGS. 13 to 18 current-voltage curves.

In the following, contact doping applicable for the planar OFET as well as the VOFET using fluorinated Buckminster fullerenes (especially, with compounds having formula $C_{60}F_x$, wherein x is an integer from 18 to 50) is described. For one material of this group, namely $C_{60}F_{36}$, the following can be shown:
1. The injection of charge carriers from a typical gold electrode into a pentacene channel is greatly improved by inserting a thin layer of fluorinated fullerene (see FIG. 6 for a VOFET).
2. Mixed layers of a semiconducting material and the dopant can generate a similar improvement.
3. The improved charge carrier injection allows using electrode materials which elsewise would show inadequate charge carrier injection in the semiconducting material (see FIG. 2 for an OFET).

The contract improving layer (or dopant layer) may comprise fluorinated fullerene. In one embodiment, the dopant layer is made from a fluorinated fullerene. Fluorinated fullerenes were shown to have a higher thermal durability as well as higher stability against solvents and other process conditions (water and oxygen) as for example F6-TCNNQ. The use of fluorinated fullerenes thus allows application of larger process windows. Consequently, using the fluorinated fullerenes leads to a higher yield of functional devices compared to F6-TCNNQ. Generally, broader selection of chemically and thermally stable materials for improving charge injection in organic transistors is needed.

In addition to the above mentioned advantages, it was found that the $C_{60}F_x$ show an unexpected process compatibility with fluorinated photoresists. As shown previously in EP 2 784 839 A1, such fluorinated photoresists can be advantageously used in process steps for the production of organic transistors. Moreover, $C_{60}F_x$ were found to be soluble in fluorinated ethers like HFE 7y00 (y=1-6, commercially available from Orthogonal Inc., USA). It was found that the $C_{60}F_{36}$ solubility is larger than 10 mg/ml. Experiments showed that $C_{60}F_x$ can be used for producing an OFET or a VOFET which are made using lift-off etching processes while using fluorinated photoresists and fluorinated ethers as solvents. Surprisingly, these transistors have a better device performance regarding the ON current and a better processability (a higher process yield and a larger window for process parameters).

Figure 6:
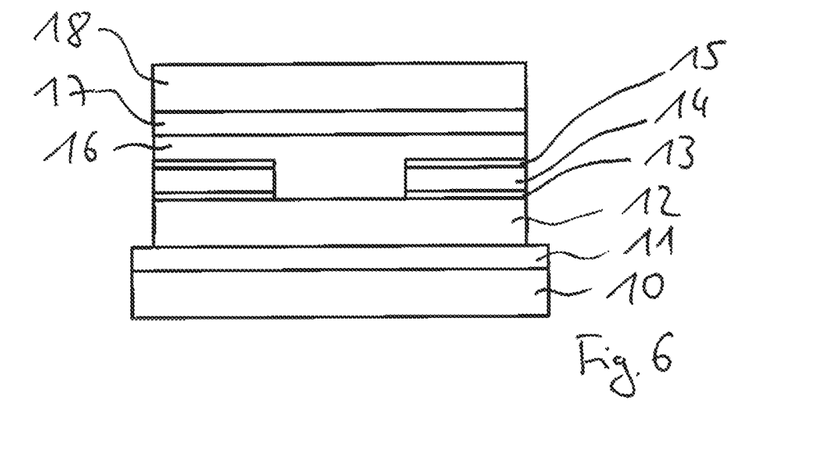

FIG. 6 shows a schematic presentation of a VOFET. The VOFET comprises a gate contact 10, for example a Si wafer, and a dielectric layer (gate insulator) 11, e.g. 30 nm $Al_2O_3$ deposited by atomic layer deposition (ALD). Further, the VOFET comprises an organic semiconducting layer 12, 16, e.g. 25 nm Pentacene applied by thermal evaporation. The VOFET comprises a contact improving layer 13, e.g. 2 nm $C_{60}F_x$ applied by thermal evaporation. On the contact improving layer 13, a source electrode 14 is provided, e.g. 50 nm Au applied by thermal evaporation. A source insulator 15 is arranged on the source electrode 14, e.g. 100 nm $SiO_2$ deposited by magnetron sputtering. A further contact improving layer 17 is provided on the organic semiconducting layer 16, e.g. 2 nm $C_{60}F_x$ applied by thermal evaporation. On top of the VOFET, a drain electrode 18 is arranged, e.g. 50 nm Au applied by thermal evaporation.

Figure 7:
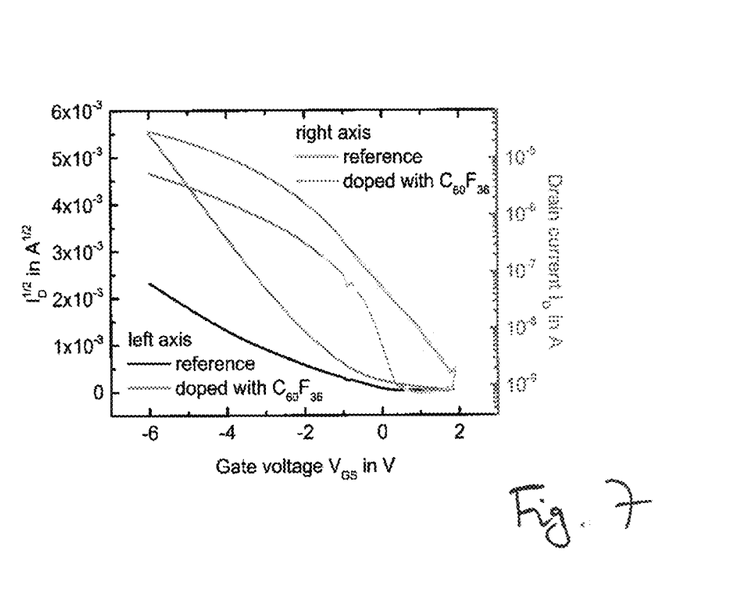

FIG. 7 shows a comparison of transfer characteristic curves with a non-doped VOFET. The left axis shows the square root of the drain current and the right axis shows the logarithm of the drain current.

Figure 8:
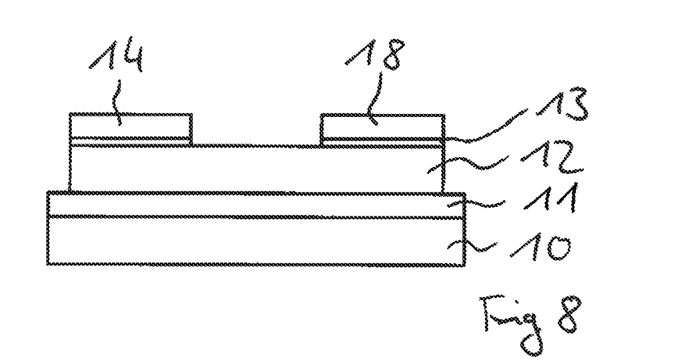
Figure 9:
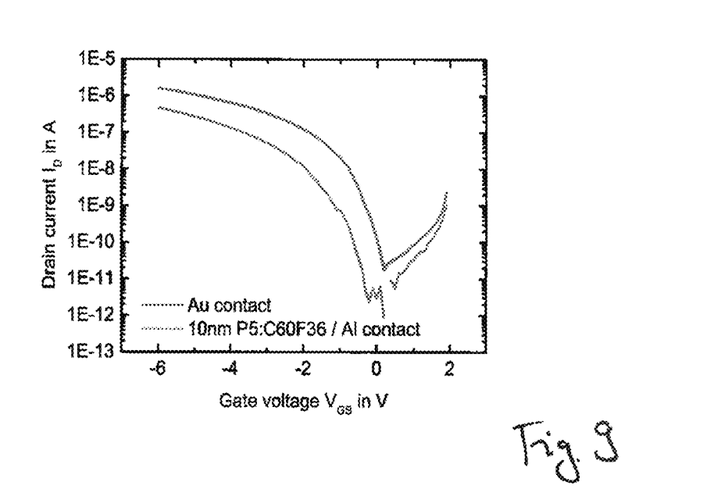

FIG. 8 shows a schematic presentation of an OFET with additional injection layers between the semiconductor and the source and drain electrodes. The OFET comprises a gate contact 10, for example a Si wafer and a dielectric layer (gate insulator) 11, e.g. 30 nm $Al_2O_3$ deposited by atomic layer deposition (ALD). The OFET further comprises an organic semiconducting layer 12, e.g. 25 nm Pentacene applied by thermal evaporation. A contact improving layer 13 is arranged on the organic semiconducting layer 12, e.g. 10 nm Pentacene doped with 2 wt % $C_{60}F_{36}$ applied by thermal evaporation. A source electrode 14 and a drain electrode 18 are provided on the contact improving layer 13, respectively, e.g. 40 nm Al applied by thermal evaporation. The electrodes are made of a non-ideal electrode material. FIG. 9 shows a comparison of the transfer characteristic curves with a non-doped OFET having an electrode made from an ideal electrode material.

Figure 10:
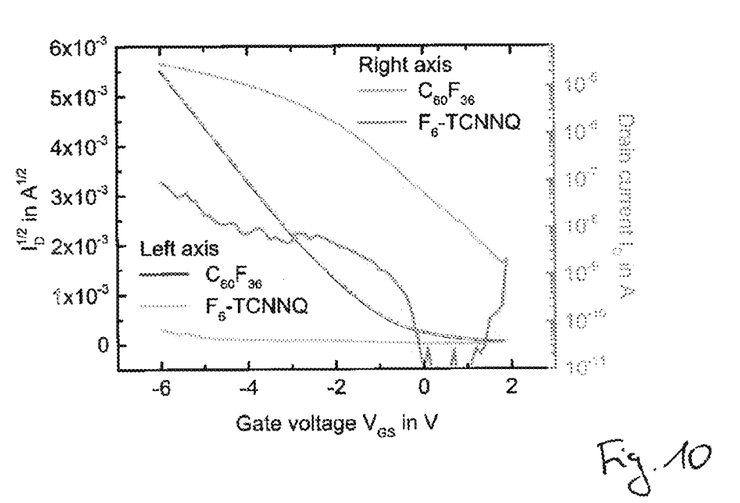

FIG. 10 shows transfer characteristic curves of two VOFETs with $C_{60}F_{36}$ and F6-TCNNQ (W=600 μm), each layer is 2 nm thick and arranged below the source as well as the drain, respectively. The insulator below the source and the drain is a layer of $SiO_2$ which is 100 nm thick.

Figure 11:
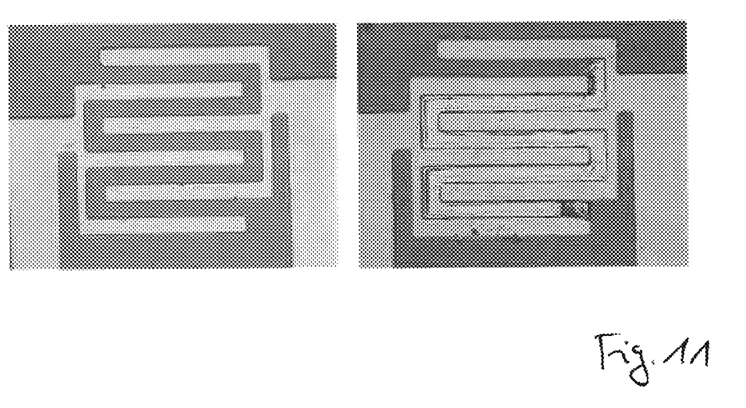

FIG. 11 shows a comparison of a good lift-off (FIG. 11, on the left) and a failed lift-off (FIG. 11, on the right). The lift-off was performed for the dopant, the source and the insulator. The lift-off on the right side failed. Parts of the mask and of the material arranged on the mask could not be removed. Thus, the required finger structure of the source electrode is not "free".

Test of solubility of p-dopants in HFE 7100 and HFE 7300 (room temperature):

F6-TCNNQ: very sparingly soluble in HFE 7100 and HFE 7300 (<0.5 mg/ml), powder (initially greenish) becomes dark-grey/violet $C_{60}F_{48}$: well soluble in HFE 7100 and HFE 7300 (>10 mg/ml)

EXAMPLE 1 (VOFET)

A n-Si wafer with a 25 nm thick $Al_2O_3$ layer (by ALD from Namlab) was used as substrate and gate electrode and gate insulator. The wafer was cleaned with isopropanol (IPA) in an ultrasound bath for 5 min and further ozone plasma etching for 10 min. The wafer was dipped in a solution of HMDS (hexamethyldisilazane) for 30 min for enhancing adherence of the organic layer to the substrate (this step is optional), and spin rinsed with IPA (1000 rpm, 30 s). 25 nm of pentacene was deposited on the $Al_2O_3$ side, onto which a 1 μm thick layer of Oscor 4000 from Orthogonal Inc. was spin coated at 30 s, and 3000 rpm. A second coating of Ma-P 1210 from Micro Resist (30 s, 3000 rpm) followed on top of the Oscor 4000 layer, forming a double layer photo resist. Both photoresists were processed under yellow light, at room temperature (RT). Heating at 100° C. for 1 min can also be applied for removal of residual solvent.

Using a mask aligner (finger grid, finger length 200 μm, lateral dimensions 30 and 50 μm), sample was exposed to a mercury lamp i-line (365 nm), dose 35 mJ/cm$^2$) for time=0.6 s and developed under yellow light at RT in an aqueous solution of 1M NaOH for 17 s (NaOH solution used as obtained from the supplier (Micro-Resist Technology GmbH, Germany) under the acronym ma-D 331) for patterning the upper photoresist layer.

Afterwards, the sample was dipped into HFE 7300 for 3 minutes and 30 seconds with posterior rinsing in HFE7300 for 30 s (all HFE solvents were obtained from Orthogonal Inc.) for patterning the lower photoresist layer. A 1 nm thick layer of $C_{60}F_{36}$ was deposited by vacuum thermal evaporation (VTE). A 50 nm thick layer of Au was deposited as first electrode using VTE. A 100 nm thick layer of $SiO_2$ was deposited by RF-sputtering. The patterning of the Au/$SiO_2$ was done by Lift-Off in HFE 7300 for 12 h in a glovebox with nitrogen gas.

For patterning the next organic layer and/or the drain electrode (not shown in the FIG. 1), a second photolithographic step followed, with the spin coating of Oscor 4000 at 30 s and 3000 rpm, and posterior coating of Ma-P 1210 at 30 s and 3000 rpm (yellow light, RT). The sample rested for 10 min. Again, using a mask aligner, the photoresist was exposed for 0.6 s (mercury lamp i-line (365 nm), dose 35 mJ/cm$^2$, finger grid (finger length 200 μm, lateral dimensions 30 and 50 μm). The developing proceeded in a solution of NaOH (NaOH used as obtained from the supplier under the acronym ma-D 331), under yellow light, at RT. The undeveloped photoresist was removed by dipping into HFE 7300 (3 min 30 s) and subsequent rinsing in HFE 7300 for 30 s (solvents from Orthogonal Inc.).

In the second deposition step, a 25 nm thick layer of pentacene was deposited (by VTE) on top of the previously made photolithographic pattern, followed by a 1 nm thick layer of $C_{60}F_{36}$ and a 50 nm thick layer of Au.

The patterning was finished by lifting-off the undesired layers by dissolution of Oscor 4000 in HFE 7300 for 12 h in a glovebox with nitrogen atmosphere, affording thus the VOFET according to FIG. 6.

EXAMPLE 2 (VOFET)

The procedure of the Example 1 was repeated, using $C_{60}F_{48}$ instead of $C_{60}F_{36}$.

EXAMPLE 3 (OFET)

The procedure of Example 1 was repeated without the second patterning and vacuum deposition step, thus affording the OFET according to FIG. 8.

EXAMPLE 4 (OFET)

The procedure of the Example 3 was repeated, using $C_{60}F_{48}$ instead of $C_{60}F_{36}$.

EXAMPLE 5 (VOFET)

A n-Si wafer with a 25 nm thick $Al_2O_3$ layer was used as substrate, gate electrode and gate insulator. The wafer was cleaned with isopropanol (IPA) in an ultrasound bath for 5 minutes and further cleaned by ozone plasma etching for 10 min. The wafer was dipped in a solution of HMDS (hexamethyldisilazane) for 30 min for enhancing adhesion of the organic layer (this step is optional), followed by spin rinsing with IPA (1000 rpm, 30 s). 25 nm thick pentacene layer was deposited by vacuum thermal evaporation (VTE) on the $Al_2O_3$ side, followed by a 1 nm thick layer of $C_{60}F_{36}$ and a 40 nm thick layer of Au. A 1 μm thick layer of Oscor 4000 from Orthogonal Inc. was spin coated on top of the Au layer at 30 s, and 1000 rpm and heated at 100° C. for 1 min. The photoresist was processed under yellow light, at room temperature (RT).

Using a mask aligner (finger grid, finger length 200 μm, lateral dimensions 30 and 50 μm), the sample was illuminated with mercury lamp i-line (365 nm), for 0.6 s, (dose 35 mJ/cm$^2$), heated for 60 s at 90° C. and developed under yellow light at RT in HFE 7300 for 2 min, to remove the unexposed photoresist from all places protected by the mask from the photocuring.

The naked (deprotected) regions of the gold electrode were subsequently etched in aqueous "potassium iodine" (potassium triiodide solution commercially available as "standard etchant gold" from Aldrich, diluted with deionized water in the volume ratio 1:5) for 2 min and finally rinsed with water.

In the region exposed by the gold removal, the $C_{60}F_{36}$ layer was subsequently etched by dipping into HFE 7300 for 2 min at RT.

In a second vacuum deposition step, 25 nm thick pentacene layer followed by 1 nm $C_{60}F_{36}$ layer and 40 nm Au layer were deposited on top of the first pentacene layer uncovered by the Au and $C_{60}F_{36}$ dissolution, as well as on top of the previously made gold electrodes covered with the photoresist.

In a second lithography step a 1 μm thick layer of Oscor 4000 from Orthogonal Inc. was spin coated on top of the Au layer at 30 s, and 1000 rpm and heated at 100° C. for 1 min. The photoresist was processed under yellow light, at room temperature (RT).

Using a mask aligner (finger grid, finger length 200 μm, lateral dimensions 30 and 50 μm), the sample was illuminated with mercury lamp i-line (365 nm) for 0.6 s (dose 35 mJ/cm$^2$), heated for 60 s at 90° C. and developed under yellow light at RT in HFE 7300 for 2 min, to remove the unexposed photoresist from all places protected by the mask from the photocuring.

The naked (deprotected) regions of the gold electrode were subsequently etched in aqueous "potassium iodine" (potassium triiodide solution commercially available as "standard etchant gold" from Aldrich, diluted with deionized water in the volume ratio 1:5) for 2 min and finally rinsed with water.

In the region exposed by the gold removal, the $C_{60}F_{36}$ layer was subsequently etched by dipping into HFE 7300 for 2 min at RT.

EXAMPLE 6 (VOFET)

The procedure of the Example 5 was repeated, using $C_{60}F_{48}$ instead of $C_{60}F_{36}$.

EXAMPLE 7 (OFET)

The procedure of the Example 5 was repeated without the second vacuum deposition step and without the second lithography step and using 1 μm thick layer of AZ1518 from Orthogonal Inc. instead of Oscor 4000. The positive photoresist was made alkali-soluble by illumination with Hg lamp i-line (365 nm) for 1.4 s (dose 80 mJ/cm$^2$), and the exposed photoresist was removed by etching with 1 M aqueous NaOH solution at RT for 1 min. Alternatively, aqueous tetramethylammonium hydroxide (TMAH) solution having concentration only 2.6 wt % was successfully used instead of NaOH. After removal of the gold layer from the sites exposed to the potassium iodine etch, the dopant was dissolved by dipping the sample for 1 min in HFE 7500 and spin-rinse with HFE 7100. The whole sample was then exposed to UV light (80 mJ/cm$^2$, 365 nm) and the remaining photoresist made by this illumination alkali soluble was dissolved by exposition to the 2.6 wt % aqueous TMAH (commercially available from Orthogonal Inc. as "developer solution") at RT for 1 min. It was found that with kresol photoresists like AZ1518, the steps of removing the photoresist and dissolving the dopant can be alternatively done also in the opposite sequence.

EXAMPLE 8 (OFET)

The procedure of the Example 7 was repeated, using $C_{60}F_{48}$ instead of $C_{60}F_{36}$.

Figure 12:
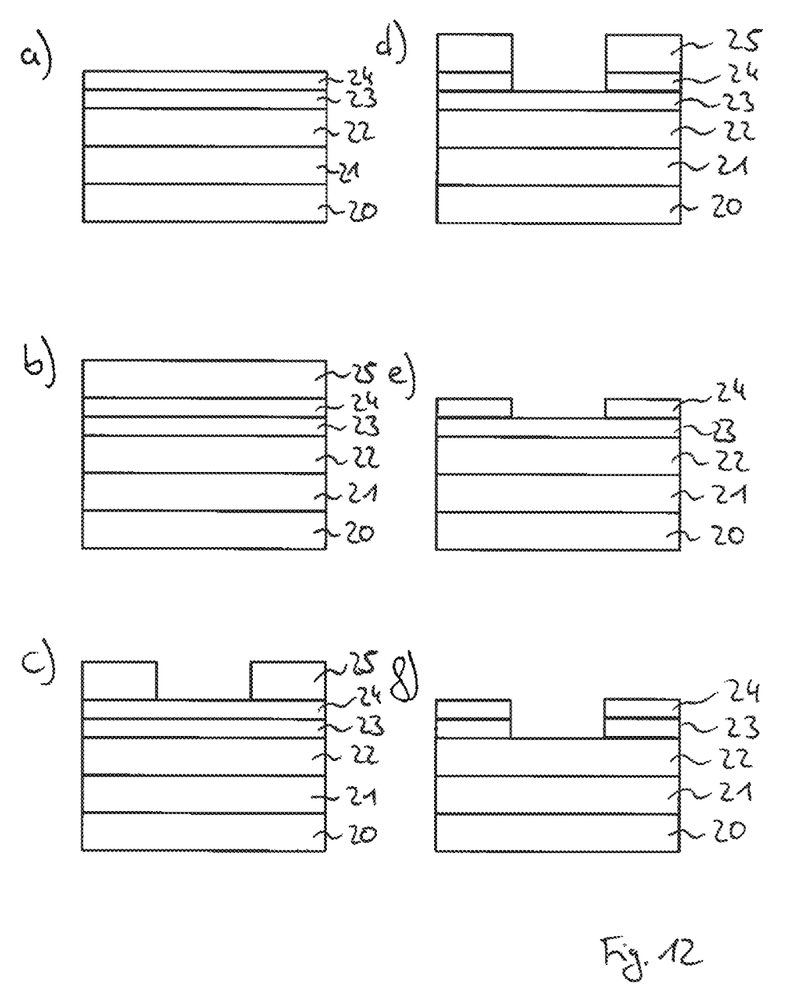
Figure 13:
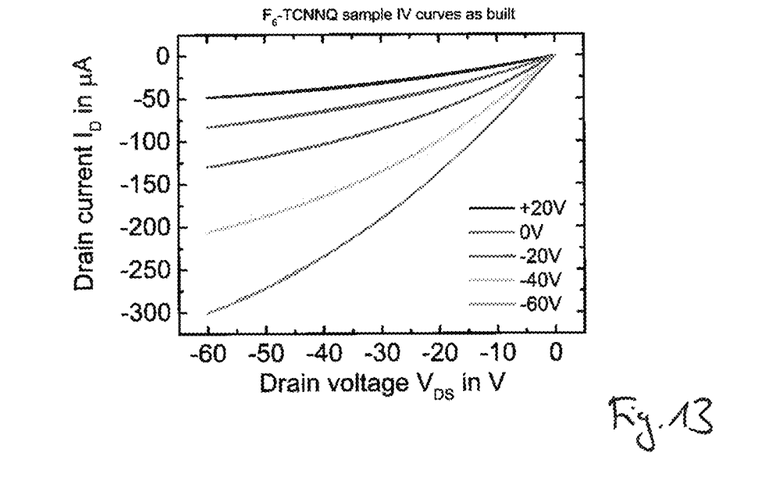
Figure 14:
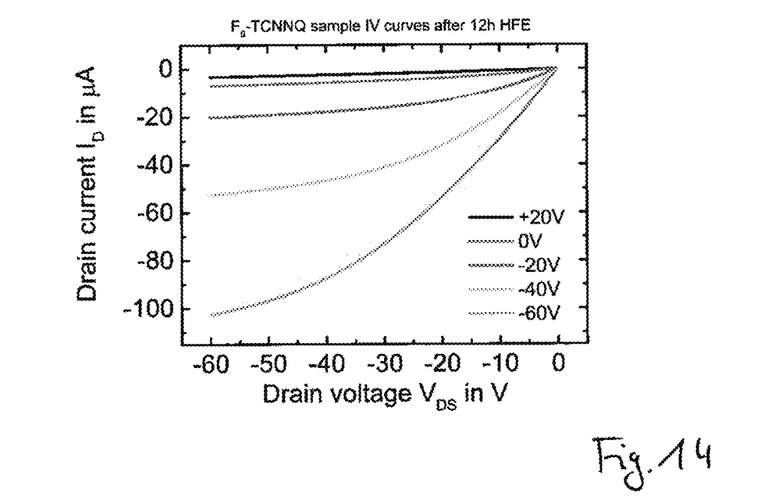
Figure 15:
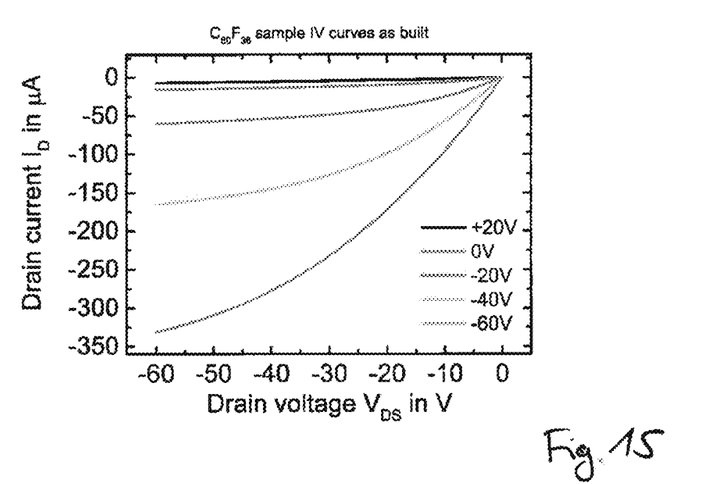
Figure 16:
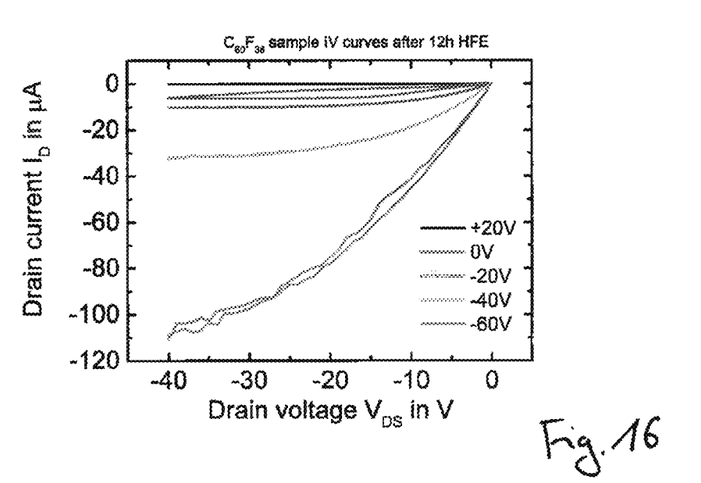
Figure 17:
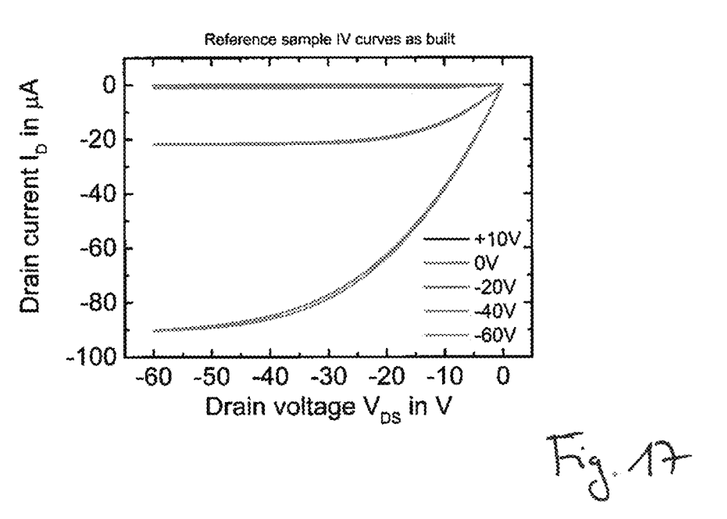

A schematic depiction of the etching process can be found in FIG. 12. FIG. 12 shows an etching process operation chart for producing an organic transistor (OFET):
a) Deposition of a metallic source/drain electrode material 24 on the dopant 23 and the organic semiconducting material 22. The semiconductor 22 is arranged on the gate insulator 21 and the gate electrode 20.
b) Deposition of the photoresist 25.
c) Exposure of the photoresist to light and processing the resist for masking.
d) Etching of the source/drain electrode material 24.
e) Removing the mask.
f) Structuring of the dopant 23 by removing it with a solvent.

The semiconductor 22, the dopant 23 and the contact metal 24 are deposited in the same area (FIG. 12a). The source electrode and the drain electrode are etched after a lithographic masking (FIG. 12b-d). In a last step, the photoresist is removed (FIG. 12e). For masking the source and drain electrode positive and negative photoresists can be used (e.g. based on cresol resin, SUB, NLOF2020, AZ1518), fluorinated photoresists (e.g. Oscor 4000), and photostructurable polymers (e.g. polymethylmethacrylate PMMA, polyvinylalcohol PVA).

EXAMPLE 9

Figure 1:
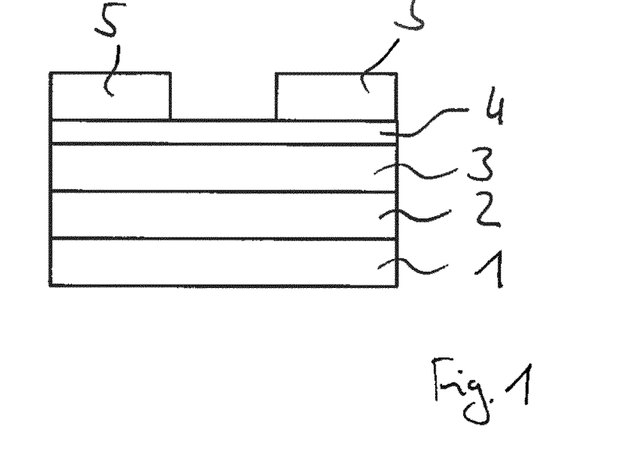

FIG. 1 shows a cross-section of a device structure. In one embodiment, a highly conductive silicon wafer is used as a substrate and as the gate electrode 1. The wafer is covered with 300 nm of SiO2 serving as a gate insulator material 2. As 30 nm thick organic semiconducting layer 3 made of pentacene is deposited in an ultra-high-vacuum chamber onto the SiO2 surface without a mask. In a second evaporation step, a 2 nm thick contact improving layer 4 made of $C_{60}F_{36}$ is deposited on top of the pentacene film 3 also without a mask. Finally, a 30 nm thick layer of Au is deposited onto the organic films using a shadow mask in order to define the source and drain electrode 5. The channel length and width are 50 μm and 1000 μm respectively.

Figure 2:
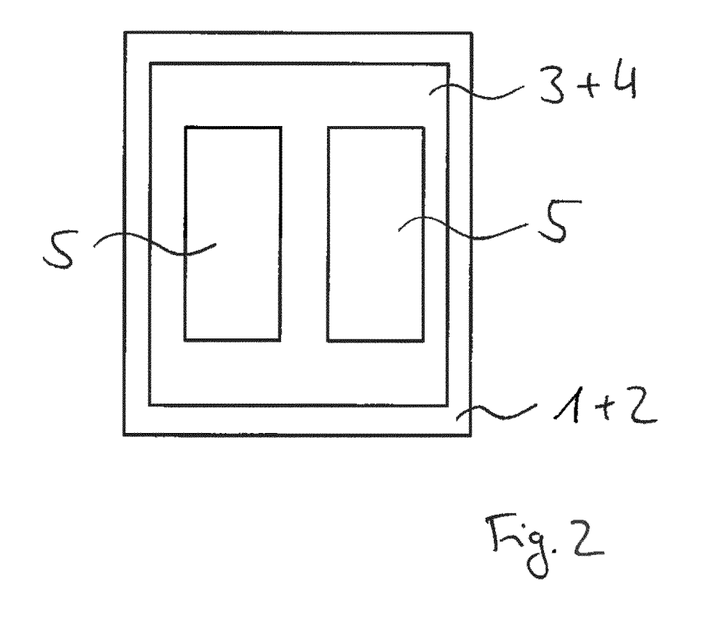

A top-view of the device of FIG. 1 is shown in FIG. 2.

Figure 3:
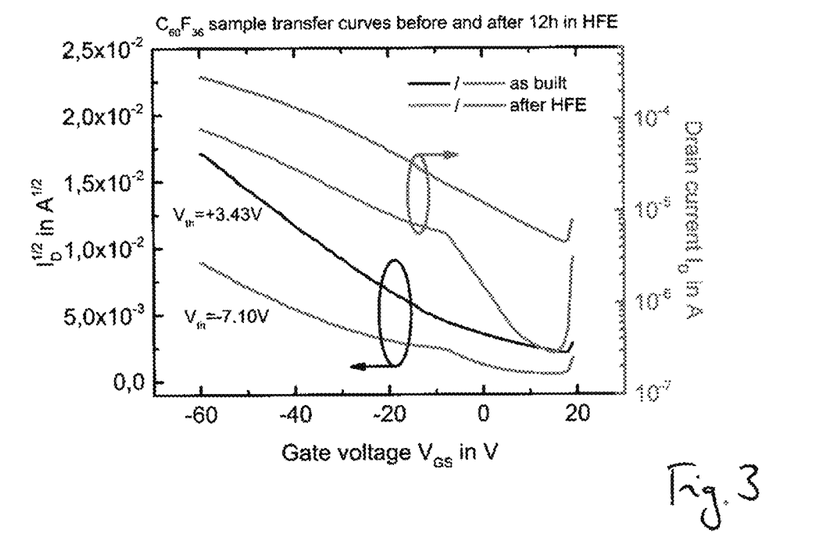

Transfer curves of the device have been measured directly after deposition in a nitrogen atmosphere as well as after a dipping step for 12 h in HFE 7100 in a nitrogen atmosphere. The transfer curves are depicted in FIG. 3 (transfer curve of the device structure with $C_{60}F_{36}$ as contact improving layer 4 as described within the embodiment before and after dipping into HFE 7100). As it can be seen in FIG. 3, the on/off ratio of the transfer is less than 50 for the freshly prepare device while after dipping in HFE 7100 the on/off ratio is significantly increased which is due to the fact that the $C_{60}F_{36}$ is partially dissolved by the HFE 7100.

Figure 4:
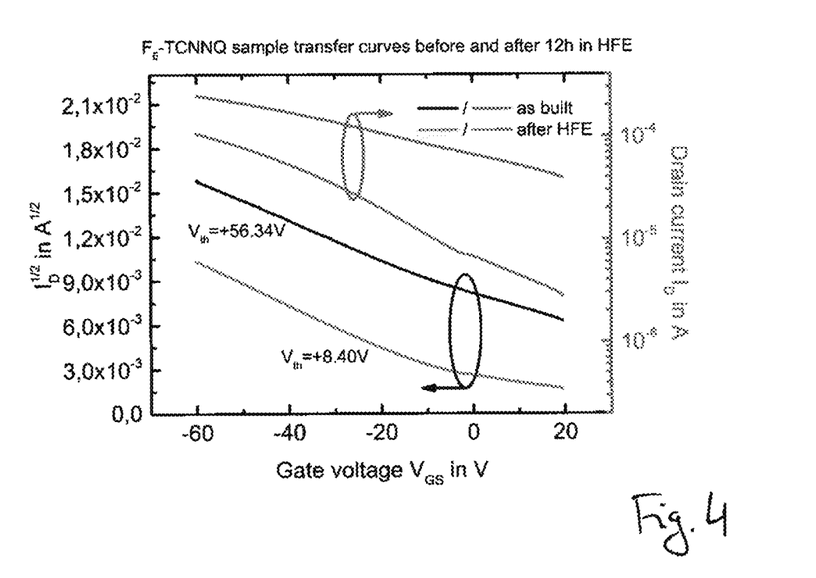
Figure 5:
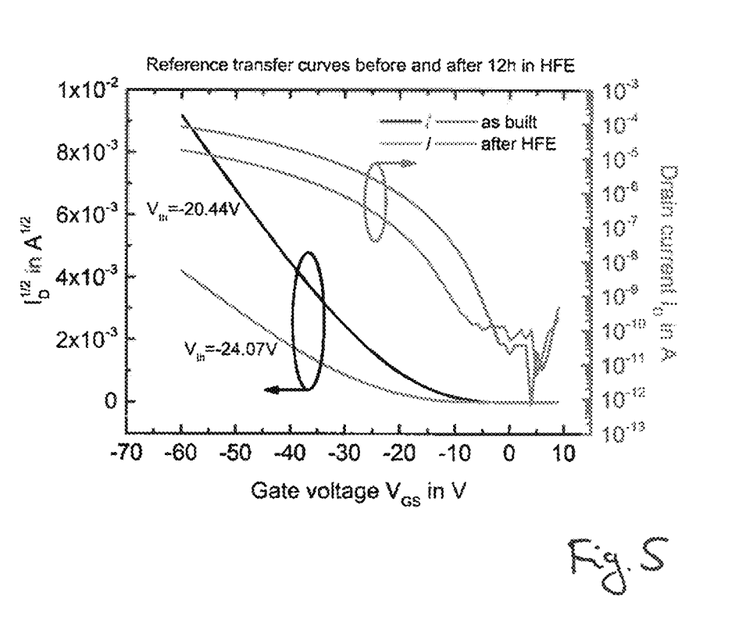

In a control experiment, the same device as described above has been processed with the difference that in one case the contact improving layer 4 is composed of 2 nm of F6-TCNNQ instead of $C_{60}F_{36}$ and in another case the contact improving layer 4 made of $C_{60}F_{36}$ has not been processed. The transfer curves of these devices have been measured directly after deposition in a nitrogen atmosphere as well as after a dipping step for 12 h in HFE 7100 in a nitrogen atmosphere. The transfer curves are depicted in FIGS. 4 and 5, respectively. FIG. 4 shows the transfer curve of the device structure with F6-TCNNQ as contact improving layer 4 as described within the embodiment before and after dipping into HFE 7100. FIG. 5 shows the transfer curve of the device structure without the contact improving layer 4 as described within the embodiment before and after dipping into HFE 7100.

In comparison to the device with $C_{60}F_{36}$ as contact improving layer 4 (FIG. 3), the on/off ratio is only slightly improved for the device with F6-TCNNQ as contact improving layer 4 after 12 h of dipping into HFE 7100 (FIG. 4). This can be explained by the fact that F6-TCNNQ is not dissolved (or hardly soluble) in HFE solvents. Looking at the off-state of the reference device without the contact improving layer 4 (FIG. 5), it can be seen that the off-state is not affected by the HFE dipping.

Figure 18:
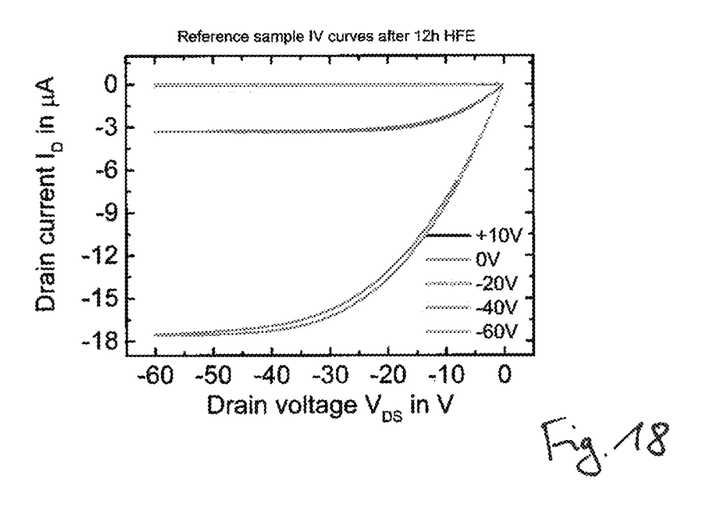

FIGS. 13 to 18 show current-voltage curves for a device with a dopant layer of F6-TCNNQ as built (FIG. 13) and after dipping in Hydrofluorether (FIG. 14), a device with a dopant layer of $C_{60}F_{36}$ as built (FIG. 15) and after dipping in Hydrofluorether (FIG. 16), and a device without a dopant layer as built (FIG. 17) and after dipping in Hydrofluorether (FIG. 18).

Alternatively to the embodiment described above, the active structuring of the dopant can be achieved by dry chemical etching, e.g. by using an oxygen plasma or an argon plasma. The dry etching method, however, may easily damage the organic semiconductor below the dopant layer, what is not the case of the selective etching with HFE solvents.

All features disclosed in the specification, the figures and the claims can be relevant for the implementation of embodiments, either alone or in any combination with each other.

LIST OF ABBREVIATIONS

HFE: Hydrofluorether,
HFE 7100: ethylnonafluorbutylether, Methylnona, . . . ,
HFE 7200: thylnonafluorbutylether, Ethylnona, . . . ,
HFE 7300: Pentane,1,1,1,2,2,3,4,5,5,5-decafluoro-3-methoxy-4-(trifluoromethyl),
HFE 7400: product of 3M, Hydrofluorether compound, formula not disclosed,
HFE 7500: Trifluormethyl-3-ethoxydodecafluorhexan,
HFE 7600: product of 3M, Hydrofluorether compound, formula not disclosed,
F6-TCNNQ: 1,3,4,5,7,8-Hexafluorotetracyanonaphthoquinodimethane,
Oscor 4000: product of Orthogonal Inc., undisclosed composition, fluorbased photoresist,
Ma-P 1210: product of Micro resist techn.,
  65-75 wt % 1-Methoxy-2propanol acetate,
  20-25 wt % cresol resin (CAS 6789000004-5653P),
  5-10 wt % Diazonapthaquinoesulfonic ester (CAS 68510-93-0),
ma-D 331: commercial material of micro resist technology,
  ~2 wt % NaOH (aq)
SU8: Commercial product of MicroChem,
  22-60 wt % Triarylsulfonium/Hexafluoroantimonate Salt CAS 89452-37-9/71449-78-0, 35-75% Epoxy resin (CAS 28906-96-9,
  1-5 wt % Propylene Carbonate (CAS 108-32-7),
  further information: http://www.lamp.umd.edu/Safety/Msds/msds_chemicals/su8resist.pdf
NLOF2020: Commercial product of AZ (negative photoresist),
  65-75 wt % 1-Methoxy-2propanol acetate, 20-25 wt % cresol resin (CAS 6789000004-5792P), other compounds<5 wt % 6789000004-5594P, 6789000004-5765P, 6789000004-5798P,
  further information:
  http://wcam.engr.wisc.edu/Public/Safety/MSDS/Photoresist%20AZ%20NLOF%202020.pdf,
AZ1518: Commercial product of AZ (positive photoresist),
  65-75 wt % 1-Methoxy-2propanol acetate, 20-25 wt % cresol resin (CAS 6789000004-5653P), 5-10 wt % Diazonapthaquinoesulfonic ester CAS 68510-930,
  further information: http://nano.tau.ac.il/mncf/images/MSDS/msds_AZ1518.pdf.

What is claimed is:

1. A method of manufacturing an organic electronic device having a layered device structure comprising a plurality of electrodes and an electronically active region that is in electrical contact with at least one of the plurality of electrodes, the method comprising:
  providing an organic semiconducting layer;
  applying a structuring layer to the organic semiconducting layer, the structuring layer having a first region and a second region;
  applying a contact improving layer to the organic semiconducting layer, at least in the first region of the structuring layer, by depositing an organic dopant material, wherein the organic dopant material is soluble in Hydrofluorether;
  depositing a layer material on the contact improving layer;
  structuring the contact improving layer; and
  removing the structuring layer at least in the second region.

2. The method of claim 1, wherein a solubility of the organic dopant material in Hydrofluorether is greater than 0.5 mg/ml.

3. The method of claim 2, wherein the solubility of the organic dopant material in Hydrofluorether is greater than 10 mg/ml.

4. The method of claim 1, wherein the Hydrofluorether is selected from the group consisting of HFE 7100, HFE 7200, HFE 7300, HFE 7400, HFE 7500, and HFE 7600.

5. The method of claim 1, wherein the organic dopant material is a fluorinated Buckminster fullerene.

6. The method of claim 5, wherein the organic dopant material is $C_{60}F_{36}$ or $C_{60}F_{48}$.

7. The method of claim 1, further comprising a step of dipping the layered device structure in Hydroflourether.

8. The method of claim 1, further comprising a step of rinsing the layered device structure with Hydroflourether.

9. The method of claim 1, wherein applying the structuring layer further comprises a photo lithographic process.

10. The method of claim 9, wherein the photo lithographic process further comprises:
  depositing a photo resist cover on the organic semiconducting layer; and
  structuring the photo resist cover, wherein structuring the photo resist cover comprises illuminating and removing the photo resist cover so that the photo resist cover is at least partially removed in at least the second region, but not the first region.

11. The method of claim 10, wherein depositing the photo resist cover further comprises:
  depositing a protection layer on the organic semiconducting layer; and
  depositing a photo resist layer on the protection layer.

12. The method of claim 9, wherein the photo lithographic process comprises fluorine based photo lithography.

13. The method of claim 1, wherein the contact improving layer is provided with a layer thickness of 1 nm to 100 nm.

* * * * *